US009960285B2

(12) United States Patent
Chou et al.

(10) Patent No.: US 9,960,285 B2
(45) Date of Patent: May 1, 2018

(54) CONTACT STRUCTURE

(71) Applicant: Taiwan Semiconductor Manufacturing Company Limited, Hsin-Chu (TW)

(72) Inventors: Chung-Yen Chou, Hsinchu (TW); Po-ken Lin, Hsinchu (TW); Shih-Chang Liu, Yuku Village (TW); Chia-Shiung Tsai, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days. days.

(21) Appl. No.: 13/659,219

(22) Filed: Oct. 24, 2012

(65) Prior Publication Data

US 2014/0110823 A1    Apr. 24, 2014

(51) Int. Cl.
*H01L 29/92* (2006.01)
*H01L 29/94* (2006.01)

(52) U.S. Cl.
CPC .................. *H01L 29/945* (2013.01)

(58) Field of Classification Search
CPC . H01L 29/945; H01L 28/90; H01L 29/66189; H01L 31/00; H01L 29/66181; H01L 28/40; H01L 28/60
USPC .................................................. 257/532, 301
See application file for complete search history.

(56) References Cited

U.S. PATENT DOCUMENTS

| 5,798,545 | A  | * | 8/1998  | Iwasa ................ H01L 27/10861 257/301 |
| 2005/0184326 | A1 | * | 8/2005 | Cheng .......................... 257/301 |
| 2007/0120169 | A1 | * | 5/2007 | Su ................... H01L 21/823807 257/301 |
| 2007/0246755 | A1 | * | 10/2007 | Lee et al. ...................... 257/288 |
| 2008/0038874 | A1 | * | 2/2008 | Lin ................. 438/118 |
| 2008/0070374 | A1 |   | 3/2008 | Su et al. |
| 2009/0127602 | A1 | * | 5/2009 | Ozaki .......................... 257/295 |
| 2012/0061798 | A1 | * | 3/2012 | Wong ................ H01L 27/10861 257/532 |
| 2013/0175666 | A1 | * | 7/2013 | Tran ........................ H01L 28/91 257/532 |

OTHER PUBLICATIONS

Taiwan Office Action dated Mar. 25, 2015, 7 pages.

* cited by examiner

*Primary Examiner* — Roy Potter
(74) *Attorney, Agent, or Firm* — Cooper Legal Group, LLC

(57) ABSTRACT

One or more techniques or systems for forming a contact structure for a deep trench capacitor (DTC) are provided herein. In some embodiments, a contact structure includes a substrate region, a first region, a second region, contact landings, a first trench region, a first landing region, and a second trench region. In some embodiments, a first region is over the substrate region and a second region is over the first region. For example, the first region and the second region are in the first trench region or the second trench region. Additionally, a contact landing over the first trench region, the second trench region, or the first landing region is in contact with the first region, the second region, or the substrate region. In this manner, additional contacts are provided and landing area is reduced, thus reducing resistance of the DTC, for example.

20 Claims, 17 Drawing Sheets

CONTACT STRUCTURE

BACKGROUND

Generally, a deep trench capacitor (DTC) is used as a capacitor, such as a replacement for a ceramic capacitor in a printed circuit board (PCB). However, a traditional DTC requires an additional landing area for a contact landing to a substrate, for example. Additionally, a traditional contact structure for a DTC is associated with a higher contact resistance.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for forming a contact structure for a deep trench capacitor (DTC) are provided herein. Generally, a dual DTC comprises a substrate region, a first region, and a second region. For example, the first region is formed over the substrate region and the second region is formed over the first region. Additionally, the substrate region comprises one or more trench regions, such as a first trench region and a second trench region. In some embodiments, a first landing region is situated between the first trench region and the second trench region. For example, at least some of the first region is formed in at least one of the first trench region or the second trench region. For example, at least some of the second region is formed over the first region in at least one of the first trench region or the second trench region. Accordingly, the contact structure comprises a first contact landing, a second contact landing, and a third contact landing. In some embodiments, the first contact landing is formed above the first trench region, the second contact landing is formed above the second trench region, and the third contact landing is formed above the first landing region. In some embodiments, the third contact landing is between the first contact landing and the second contact landing. For example, the first contact landing and the second contact landing are in contact with the second region. The third contact landing is in contact with at least one of the substrate region or the first region. In this way, a landing area of the contact structure is reduced, at least because the third contact to at least one of the substrate or the first region is above the first landing region, rather than on a side of the contact structure. Additionally, the contact structure enables one or more additional contact landings to at least one of the substrate or the first region to be formed. In this way, a number of contact landings is increased, thus decreasing a resistance associated with the contact structure and increasing a capacitance associated with the contact structure. It will be appreciated that no additional masks are associated with the contact structure. For example, in some embodiments, two masks are used to form the contact structure for the DTC.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
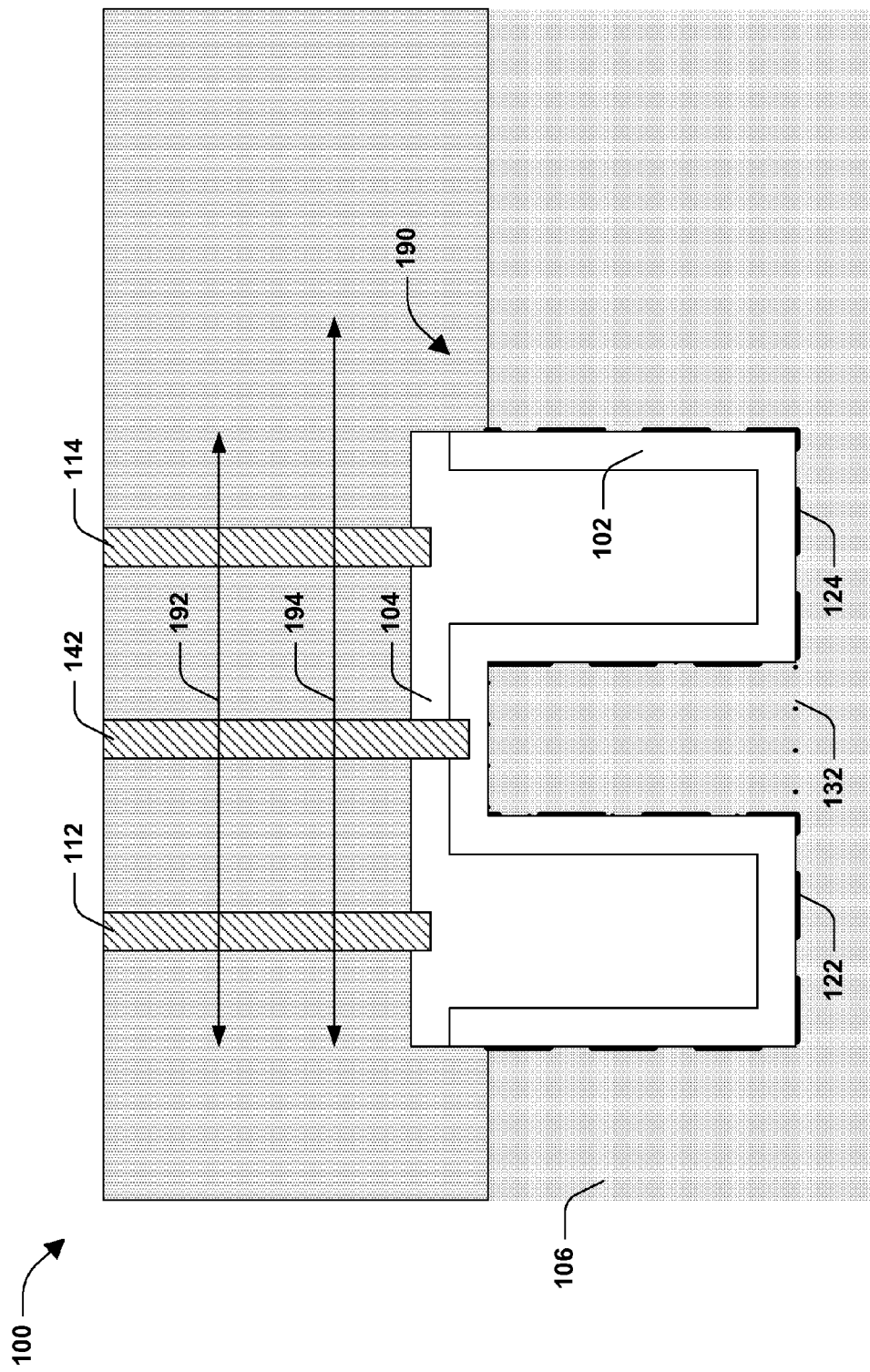
FIG. 1 is a cross-sectional view of an example contact structure for a deep trench capacitor (DTC), according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

It will be appreciated that 'layer', 'surface', or 'coat', as used herein, contemplates a region, and does not necessarily comprise a uniform thickness. For example, a layer is a region, such as an area comprising arbitrary boundaries. For another example, a layer is a region comprising at least some variation in thickness.

FIG. 1 is a cross-sectional view of an example contact structure 100 for a deep trench capacitor (DTC), according to some embodiments. For example, the DTC is a dual DTC comprising a first region, such as a first polysilicon region and a second region, such as a second polysilicon region. In some embodiments, the contact structure 100 comprises a substrate region 106, a first region 102, a second region 104, a first contact landing 112, a second contact landing 114, and a third contact landing 142. For example, the substrate region 106 comprises a first trench region 122, a second trench region 124, and a first landing region 132. It will be appreciated that the first trench region 122, the second trench region 124, and the first landing region 132 are locations within the substrate region 106 according to some embodiments. According to some aspects, the first landing region 132 is between the first trench region 122 and the second trench region 124. In some embodiments, at least some of the first region 102 is formed above at least one of the first landing region 132 or at least some of the substrate region 106. Additionally, at least some of the first region 102 is formed in at least one of the first trench region 122 or the second trench region 124. In some embodiments, at least some of the second region 104 is formed above at least some of the first region 102. Additionally, at least some of the second region 104 is formed in at least one of the first trench region 122 or the second trench region 124.

For example, at least one of the first trench region 122 or the second trench region 124 is etched or removed from the substrate region 106. The first region 102 is deposited on the substrate region 106, in the first trench region 122, or in the second trench region 124. Similarly, the second region 104 is deposited on the first region 102, in the first trench region 122, or in the second trench region 124.

In some embodiments, the first contact landing 112 is formed above the first trench region 122. For example, the first contact landing 112 is in contact with the second region 104. In some embodiments, the second contact landing 114 is formed above the second trench region 124. For example, the second contact landing 114 is in contact with the second region 104. In some embodiments, the third contact landing 142 is formed above the first landing region 132. For example, the third contact landing 142 is in contact with the first region 102. In some embodiments, the third contact landing 142 is in contact with at least one of the first region 102 or the substrate region 106. In this way, a contact landing area is reduced. For example, the third contact landing 142 is located above the first landing region 132, rather than at 190. If the third contact landing 142 is located at 190, the contact structure 100 is associated with width 194. However, by placing the third contact landing 142 above the first landing region 132, the contact structure 100 of FIG. 1 comprises a reduced width, such as width 192. In some embodiments, a contact landing, such as the third contact landing 142 is placed at 190. In some embodiments, the third contact landing 142 at 190 is in contact with the substrate region 106. In other embodiments, the third contact landing 142 at 190 is in contact with the first region 102 (not shown). In this way, a chip size is reduced for a chip utilizing contact structure 100, for example. In some embodiments, a number of contacts for the contact structure 100 is increased. For example, placing a contact landing above a landing region, such as the third contact landing 142 above the first landing region 132 enables the contact structure 100 to comprise one or more additional contact landings. In this way, a number of contact landings for the contact structure 100 is increased. In some embodiments, the increase in the number of contact landings is associated with an increase in contact area for the contact structure 100. Therefore, an increased number of contact landings for contact structure 100 is associated with a decrease in a resistance for contact structure 100 and an increase in capacitance for a deep trench capacitor associated with the contact structure 100, at least because the contact area is increased. In this way, the contact structure 100 for the DTC provides for a reduced resistance and an increased capacitance.

Figure 2:
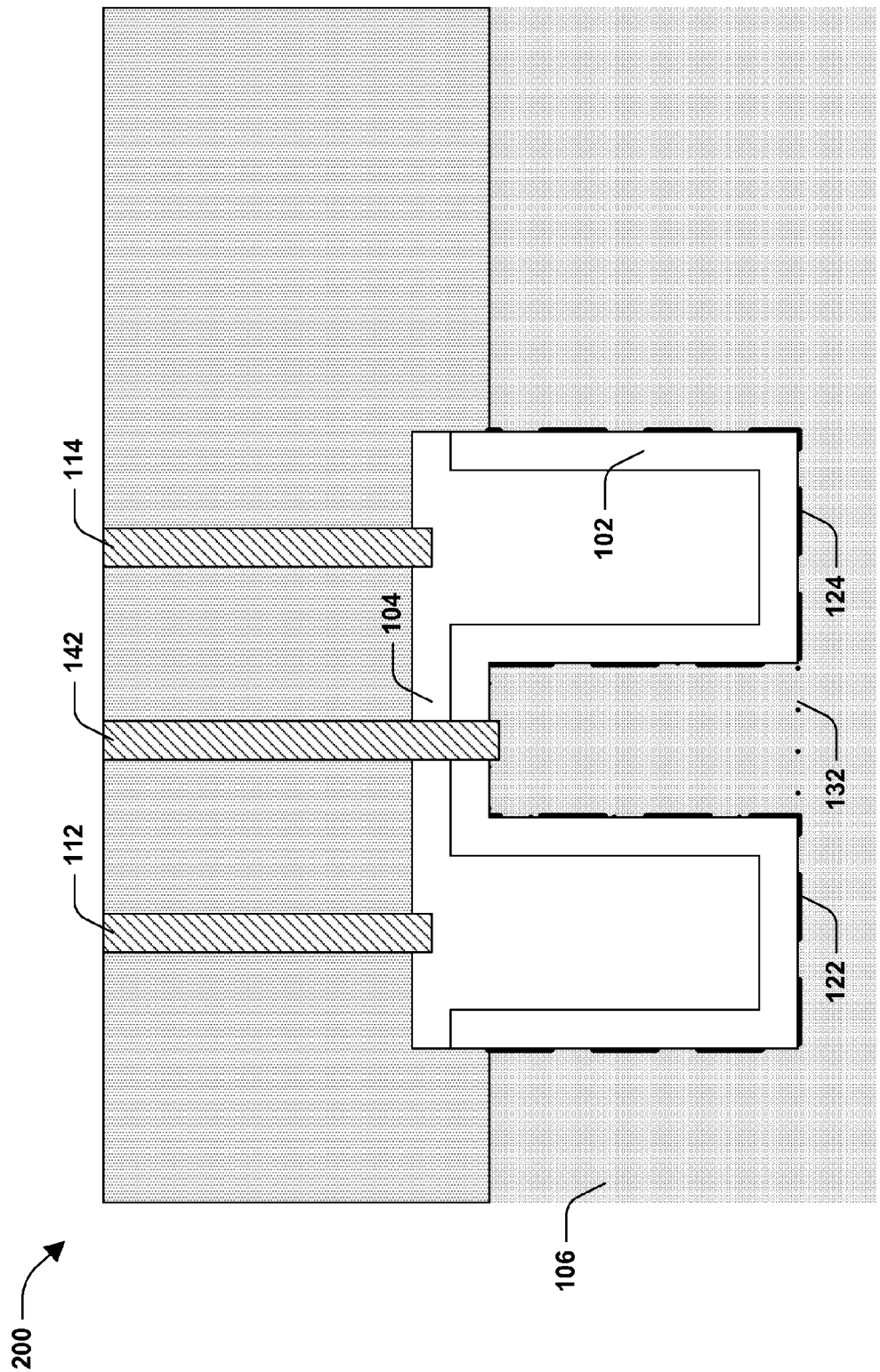
FIG. 2 is a cross-sectional view of an example contact structure for a deep trench capacitor (DTC), according to some embodiments.

FIG. 2 is a cross-sectional view of an example contact structure 200 for a deep trench capacitor (DTC), according to some embodiments. It will be appreciated that the contact structure 200 of FIG. 2 is similar to the contact structure 100 of FIG. 1, except that the third contact landing 142 of the contact structure 200 of FIG. 2 is in contact with the substrate region 106, rather than the first region 102, as illustrated in FIG. 1.

Figure 3:
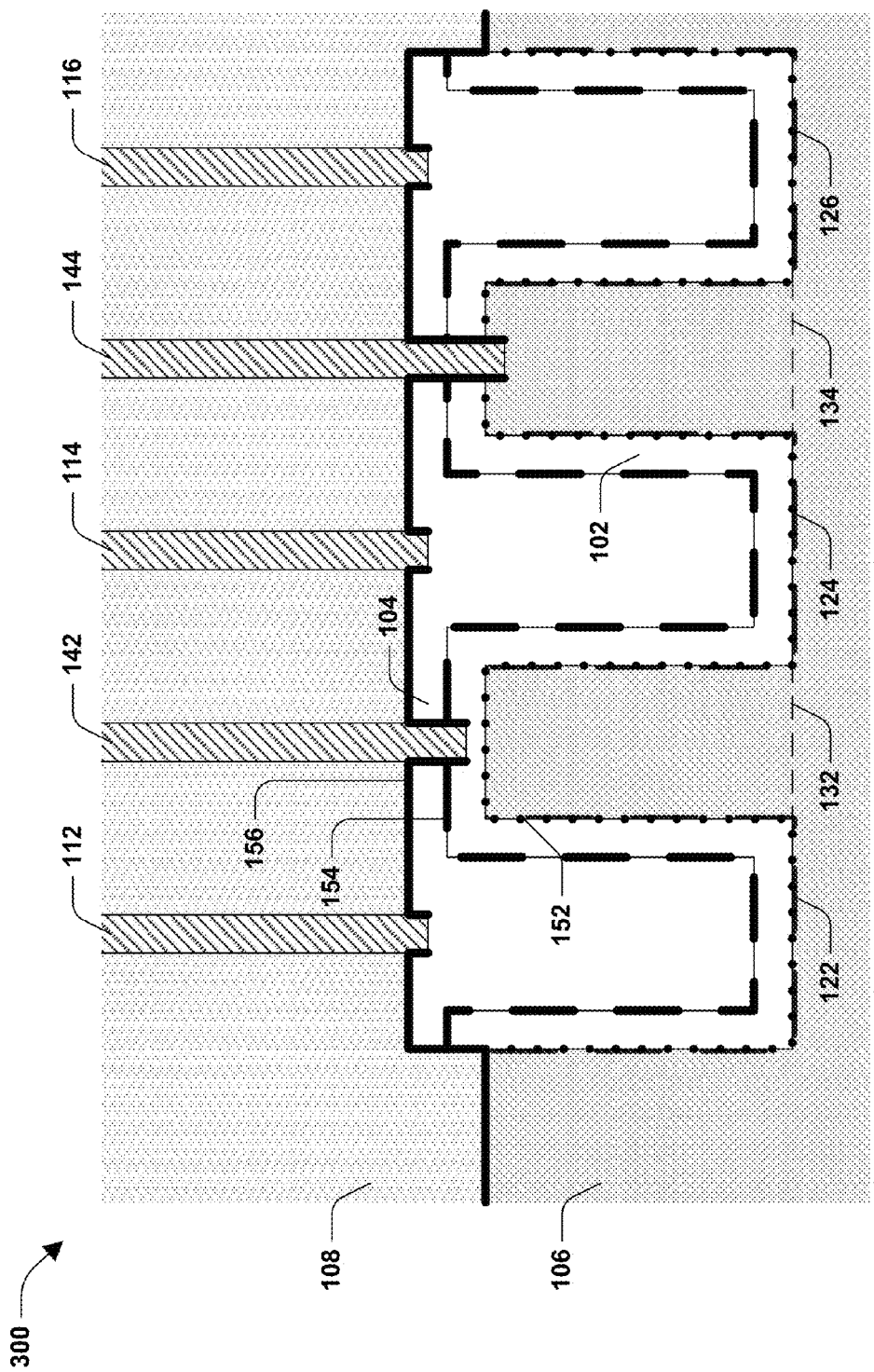
FIG. 3 is a cross-sectional view of an example contact structure for a deep trench capacitor (DTC), according to some embodiments.

FIG. 3 is a cross-sectional view of an example contact structure 300 for a deep trench capacitor (DTC), according to some embodiments. In some embodiments, the DTC is a dual DTC comprising a first region and a second region. For example, the dual DTC comprises a first polysilicon region and a second polysilicon region. In some embodiments, the contact structure 300 of FIG. 3 comprises a substrate region 106, a first dielectric region 152, a first region 102, a second dielectric region 154, a second region 104, a third region 156, an oxide region 108, a first contact landing 112, a second contact landing 114, a third contact landing 142, a fourth contact landing 144, and a fifth contact landing 116. In some embodiments, the substrate region 106 comprises one or more trench regions and one or more landing regions. For example, the substrate region 106 comprises a first trench region 122, a second trench region 124, and a third trench region 126. Additionally, the substrate region 106 comprises a first landing region 132 and a second landing region 134. In some embodiments, the first landing region 132 is between the first trench region 122 and the second trench region 124. Additionally, the second landing region 134 is between the second trench region 124 and the third trench region 126. In some embodiments, at least one of the first trench region 122, the second trench region 124, or the third trench region 126 is etched or removed from the substrate region 106.

In some embodiments, the substrate region 106 comprises silicon. For example, the substrate region 106 comprises a p-type substrate or p-type silicon. In some embodiments, at least one of the first trench region 122, the second trench region 124, the third trench region 126, the first landing region 132, or the second landing region 134 is doped with an n-type or comprises an n-type doping, for example. Additionally, at least one of the first region 102 or the second region 104 comprises polysilicon or poly. In some embodiments, at least one of the first dielectric region 152 or the second dielectric region 154 comprise dielectric. In some embodiments, the third region 156 comprises a nitride, such as silicon nitride, for example. In some embodiments, the third region 156 comprises any material with a high selectivity to oxide. For example, the material is associated with an oxide to silicon nitride (SiN) selectivity greater than twenty. Additionally, the oxide region 108 comprises oxide. According to some aspects, at least one of the contact landings 112, 114, 142, 144, or 116 comprises metal.

It will be appreciated that one or more regions are formed over or above the substrate region 106. For example, at least one of the first dielectric region 152, the second dielectric region 154, the first region 102, or the second region 104 are formed above the substrate region 106. However, it will be appreciated that the respective regions are formed within at least one of the first trench region 122, the second trench region 124, or the third trench region 126. For example, at least some of the first dielectric region 152 is above at least some of the substrate region. Additionally, at least some of the first dielectric region 152 is in at least one of the first trench region 122, the second trench region 124, or the third trench region 126. In some embodiments, at least some of first region 102 is above at least some of the first dielectric region 152. Additionally, at least some of the first region 102 is in at least one of the first trench region 122, the second trench region 124, or the third trench region 126. According to some aspects, the first dielectric region 152 is between the first region 102 and the substrate region 106. In some embodiments, at least some of second dielectric region 154 is above at least some of the first region 102. Additionally, at least some of the second dielectric region 154 is in at least one of the first trench region 122, the second trench region 124, or the third trench region 126. According to some aspects, the first region 102 is between the first dielectric region 152 and the second dielectric region 154. In some embodiments, at least some of a second region 104 is above at least some of the second dielectric region 154. Additionally, at least some of the second region 104 is in at least one of the first trench region 122, the second trench region 124, or the third trench region 126. According to some aspects, the second dielectric region 154 is between the first region 102 and the second region 104.

In some embodiments, at least some of a third region 156 is above at least some of the second region 104. Additionally, at least some of the third region 156 is in a contact landing space (not labeled in FIG. 3), such as along a wall of the contact landing space. Additionally, the third region 156 will be described in further detail herein. For example, a contact landing space is a space that is etched in the second region 104 for a contact landing, such as the first contact landing 112. According to some aspects, the second region 104 is between the third region 156 and the second dielectric region 154. In some embodiments, at least some of an oxide region 108 is above at least some of at least one of the second region 104 or the third region 156. According to some aspects, the third region 156 is between the oxide region 108 and the second region 104. In some embodiments, the third region 156 is configured to mitigate overlap issues due to etching with multiple masks. In some embodiments, the third region 156 is configured to facilitate alignment of one or more contact landings, such as at least one of the first contact landing 112, the second contact landing 114, the third contact landing 142, the fourth contact landing 144, or the fifth contact landing 116, by providing physical or structural support for the respective contact landings, for example.

In some embodiments, a contact landing is formed in a deep trench area. For example, the first contact landing 112 is in a first contact landing space above the first trench region 122 and is in contact with the second region 104. Similarly, the second contact landing 114 is in a second contact landing space above the second trench region 124 and is in contact with the second region 104. Additionally, the fifth contact landing 116 is in a fifth contact landing space above the third trench region 126 and is in contact with the second region 104. In some embodiments, the third contact landing 142 and the fourth contact landing 144 are in a third contact landing space above the first landing region 132 and a fourth contact landing space above the second landing region 134, respectively. In other words, the third contact landing 142 and the fourth contact landing 144 are formed above a deep trench area, at least because the respective contact landings are not formed at an edge of the contact structure 300. In some embodiments, the third contact landing 142 is in contact with the first region 102 and the fourth contact landing 144 is in contact with the substrate region 106, for example. Accordingly, since the third contact landing 142 and the fourth contact landing 144 are situated above the first and second landing regions 132 and 134, respectively, a width associated with the contact structure 300 of FIG. 3 is reduced. For example, a landing region to at least one of the first region 102 or the substrate region 106 is moved from an edge of the contact structure 300 to above a landing region, such as the first landing region 132 or the second landing region 134, thereby reducing the width of the contact structure 300, at least because landing area associated with the edge of the contact structure 300 is mitigated by moving contact landings to the deep trench area. Additionally, one or more additional contact landings, such as the third contact landing 142 or the fourth contact landing 144, are configured to provide access, such as electrical connectivity to at least one of the first region 104 or the substrate region 106. In this way, the additional contact landings increase a number of contact landings and provides additional contact area for the contact structure 300, thus reducing a resistance associated with the contact structure 300 and enhancing or increasing a capacitance associated with a deep trench capacitor (DTC) utilizing the contact structure 300. Additionally, it will be appreciated that no additional masks are required, and therefore there is no mask level increase associated with the contact structure 300 of FIG. 3.

Figure 4:
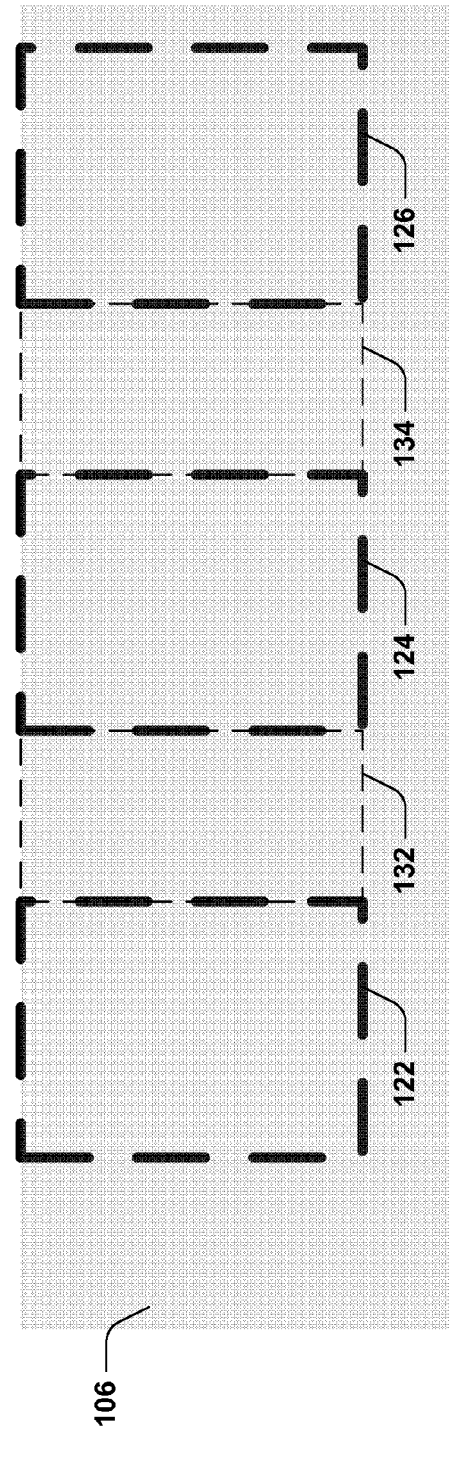
FIG. 4 is a cross-sectional view of an example contact structure for a deep trench capacitor (DTC) during formation, according to some embodiments.

FIG. 4-FIG. 16 illustrate an example formation process for a contact structure for a deep trench capacitor (DTC), according to some embodiments. It will be appreciated that the respective figures are described with reference to one another, such as with reference to a previous figure, for example. Accordingly, FIG. 4 is a cross-sectional view of an example contact structure 400 for a deep trench capacitor (DTC) during formation, according to some embodiments. For example, the contact structure 400 of FIG. 4 comprises a substrate region 106. In some embodiments, the substrate region 106 is associated with one or more trench regions and one or more landing regions. For example, the substrate region 106 is associated with a first trench region 122, a second trench region 124, and a third trench region 126. Additionally, the substrate region 106 is associated with a first landing region 132 and a second landing region 134. In some embodiments, the first trench region 122 is adjacent to the first landing region 132. The first landing region 132 is between to the first trench region 122 and the second trench region 124. According to some aspects, the second trench region 124 is between the first landing region 132 and the second landing region 134. Additionally, the second landing region 134 is between the second trench region 124 and the third trench region 126. In some embodiments, the third trench region 126 is adjacent to the second landing region 134. It will be appreciated that in the contact structure 400 of FIG. 4, the respective trench regions 122, 124, 126 and the respective landing regions 132 and 134 are indicative of locations within the substrate region 106. In some embodiments, the substrate region 106 comprises a silicon substrate.

Figure 5:
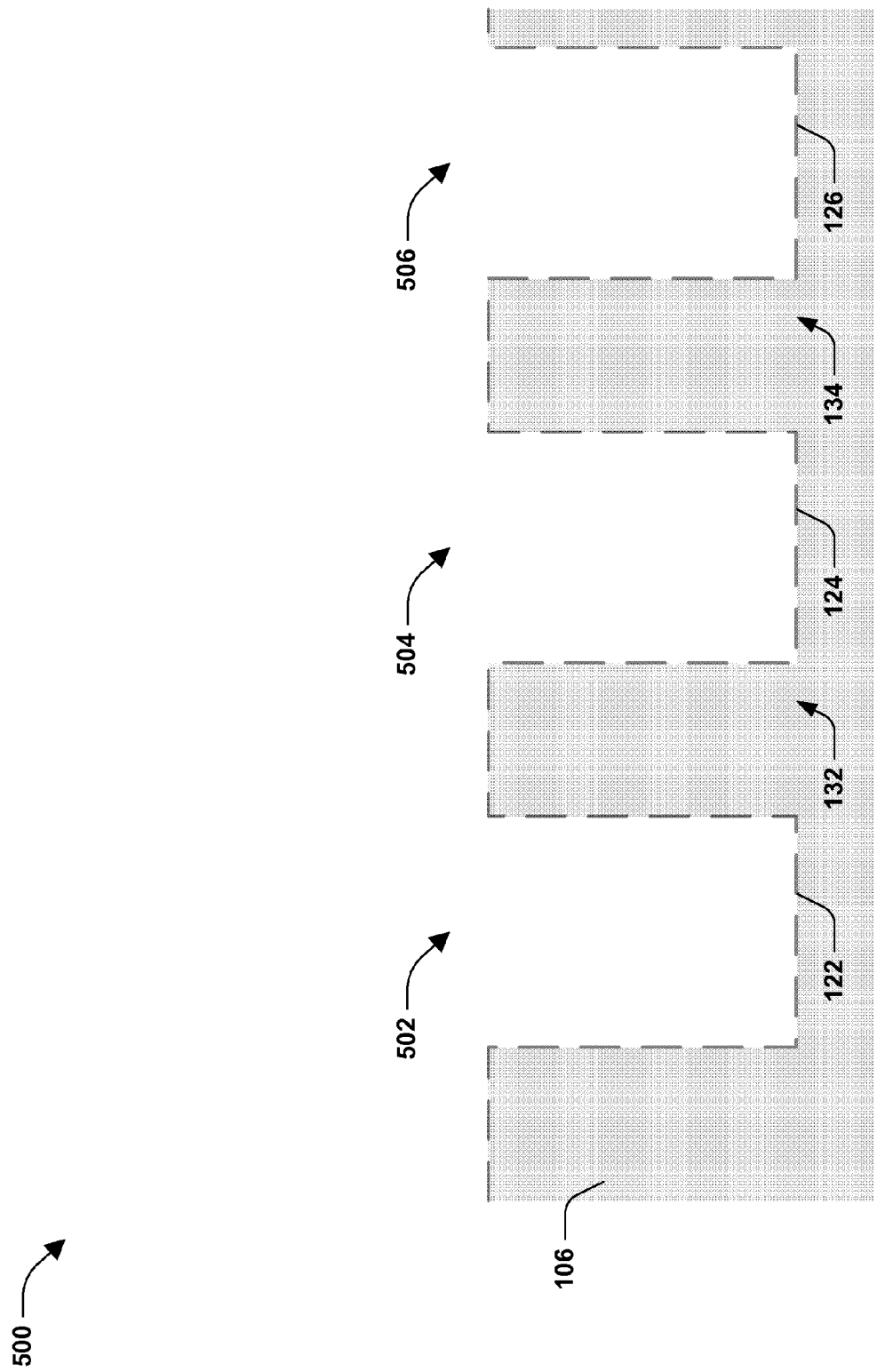
FIG. 5 is a cross-sectional view of an example contact structure for a deep trench capacitor (DTC) during formation, according to some embodiments.

FIG. 5 is a cross-sectional view of an example contact structure 500 for a deep trench capacitor (DTC) during formation, according to some embodiments. In FIG. 5, the substrate of substrate region 106 is etched or removed from at least one of the first trench region 122, the second trench region 124, or the third trench region 126. Accordingly, the first landing region 132 is between the first trench region 122 and the second trench region 124. Similarly, the second landing region 134 is between the second trench region 124 and the third trench region 126. In some embodiments, a first trench 502 is formed in the first trench region 122. Similarly, a second trench 504 and a third trench 506 are formed in the second trench region 124 and the third trench region 126, respectively.

Figure 6:
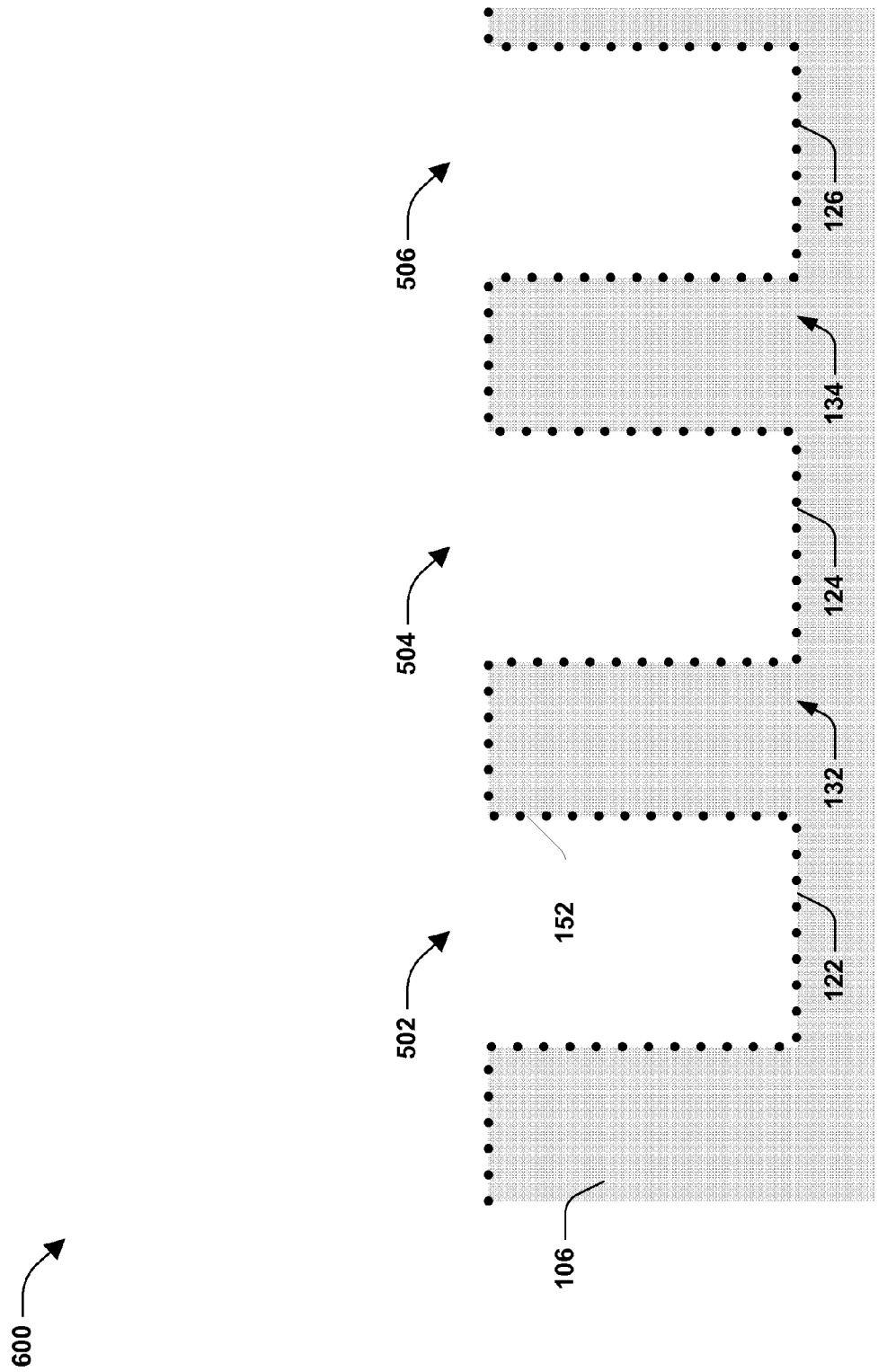
FIG. 6 is a cross-sectional view of an example contact structure for a deep trench capacitor (DTC) during formation, according to some embodiments.

FIG. 6 is a cross-sectional view of an example contact structure 600 for a deep trench capacitor (DTC) during formation, according to some embodiments. In some embodiments, at least some of a first dielectric region 152 is formed above at least some of the substrate region 106. Additionally, at least some of the first dielectric region 152 is formed in at least one of the first trench region 122, the second trench region 124, or the third trench region 126. It will be appreciated that in some embodiments, the first dielectric region 152 is formed as a 'layer' above the substrate region 106, for example.

Figure 7:
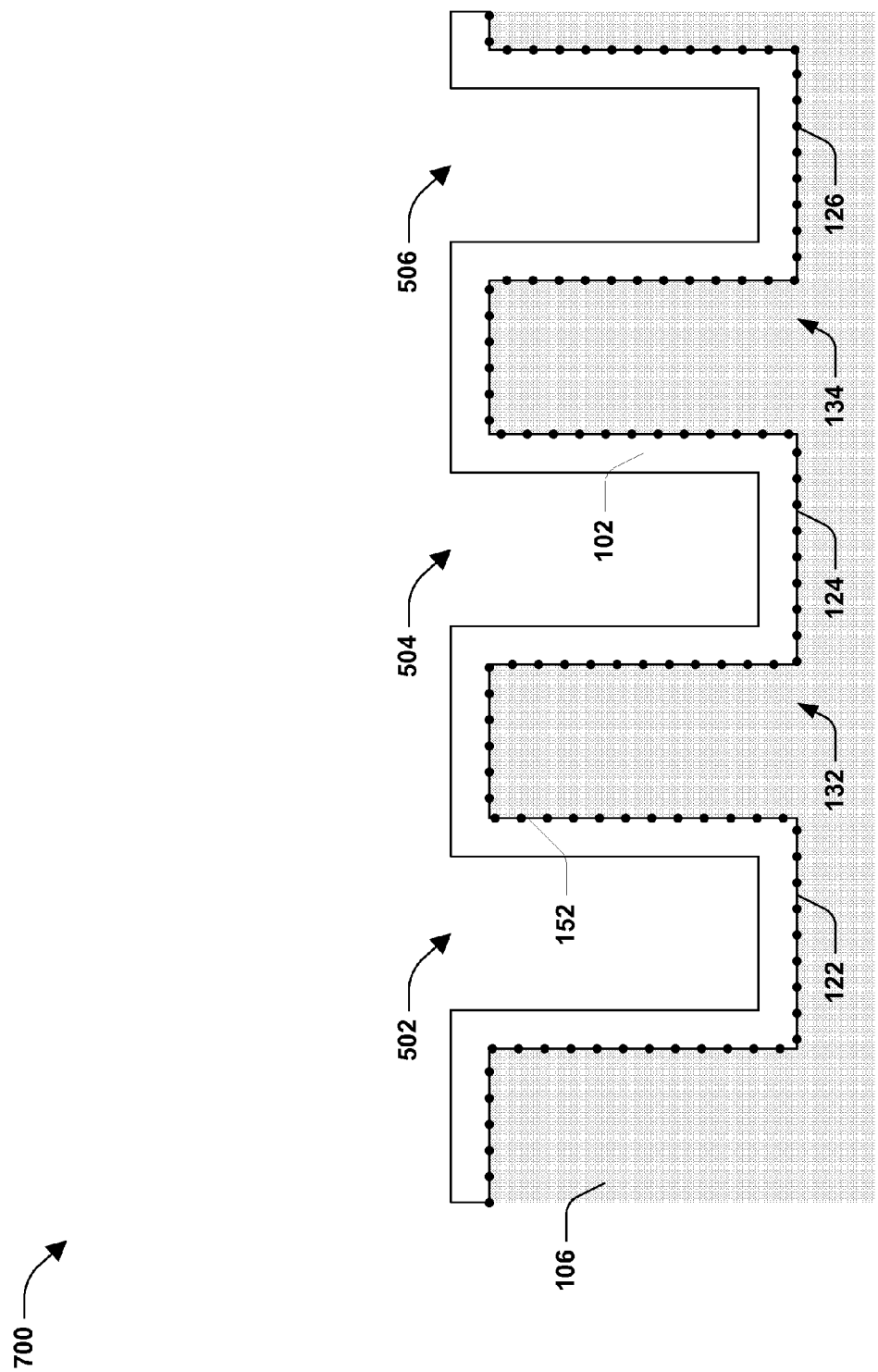
FIG. 7 is a cross-sectional view of an example contact structure for a deep trench capacitor (DTC) during formation, according to some embodiments.

FIG. 7 is a cross-sectional view of an example contact structure 700 for a deep trench capacitor (DTC) during formation, according to some embodiments. In some embodiments, at least some of a first region 102 is formed above at least some of at least one of the substrate region 106 or the first dielectric region 152. Additionally, at least some of the first region 102 is formed in at least one of the first trench region 122, the second trench region 124, or the third trench region 126. It will be appreciated that in some embodiments, the first region 102 is formed as a 'layer' above the first dielectric region 152, for example.

Figure 8:
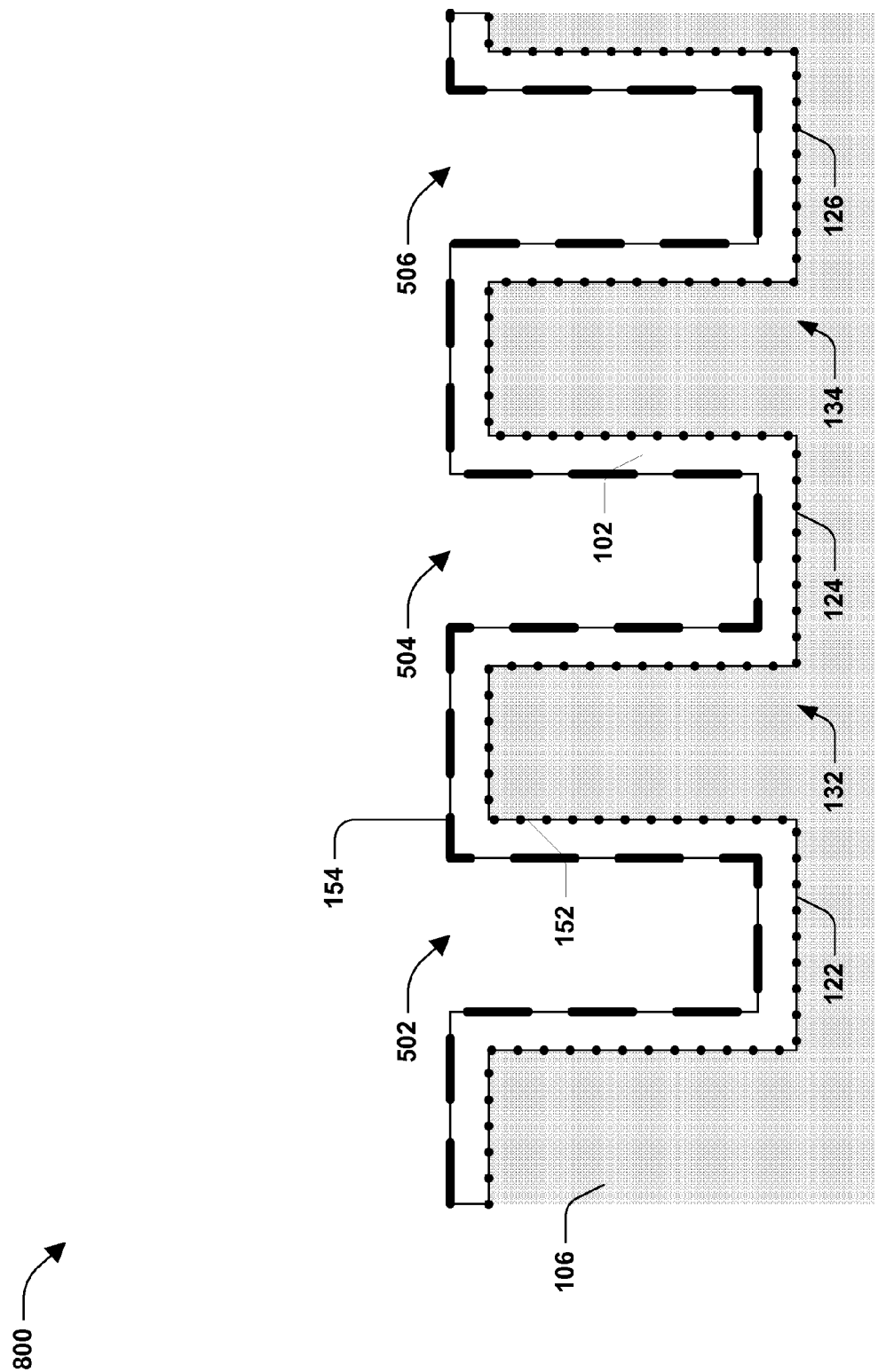
FIG. 8 is a cross-sectional view of an example contact structure for a deep trench capacitor (DTC) during formation, according to some embodiments.

FIG. 8 is a cross-sectional view of an example contact structure 800 for a deep trench capacitor (DTC) during formation, according to some embodiments. In some embodiments, at least some of a second dielectric region 154 is formed above at least some of at least one of the substrate region 106, the first dielectric region 152, or the first region 102. Additionally, at least some of the second dielectric region 154 is formed in at least one of the first trench region 122, the second trench region 124, or the third trench region 126. It will be appreciated that in some embodiments, the second dielectric region 154 is formed as a 'layer' above the first region 102, for example.

Figure 9:
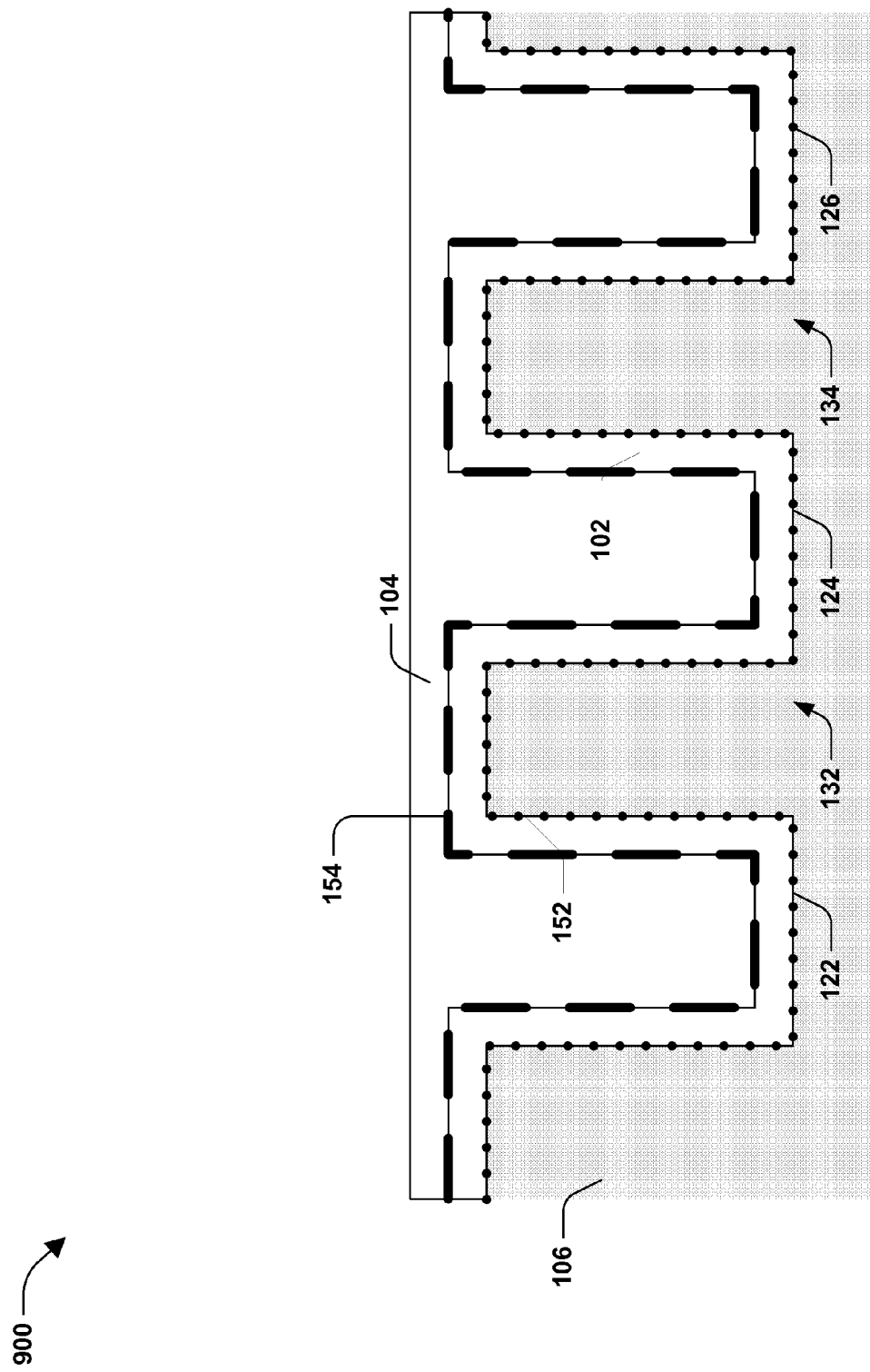
FIG. 9 is a cross-sectional view of an example contact structure for a deep trench capacitor (DTC) during formation, according to some embodiments.

FIG. 9 is a cross-sectional view of an example contact structure 900 for a deep trench capacitor (DTC) during formation, according to some embodiments. In some embodiments, at least some of a second region 104 is formed above at least some of at least one of the substrate region 106, the first dielectric region 152, the first region 102, or the second dielectric region 154. Additionally, at least some of the second region 104 is formed in at least one of the first trench region 122, the second trench region 124, or the third trench region 126.

Figure 10:
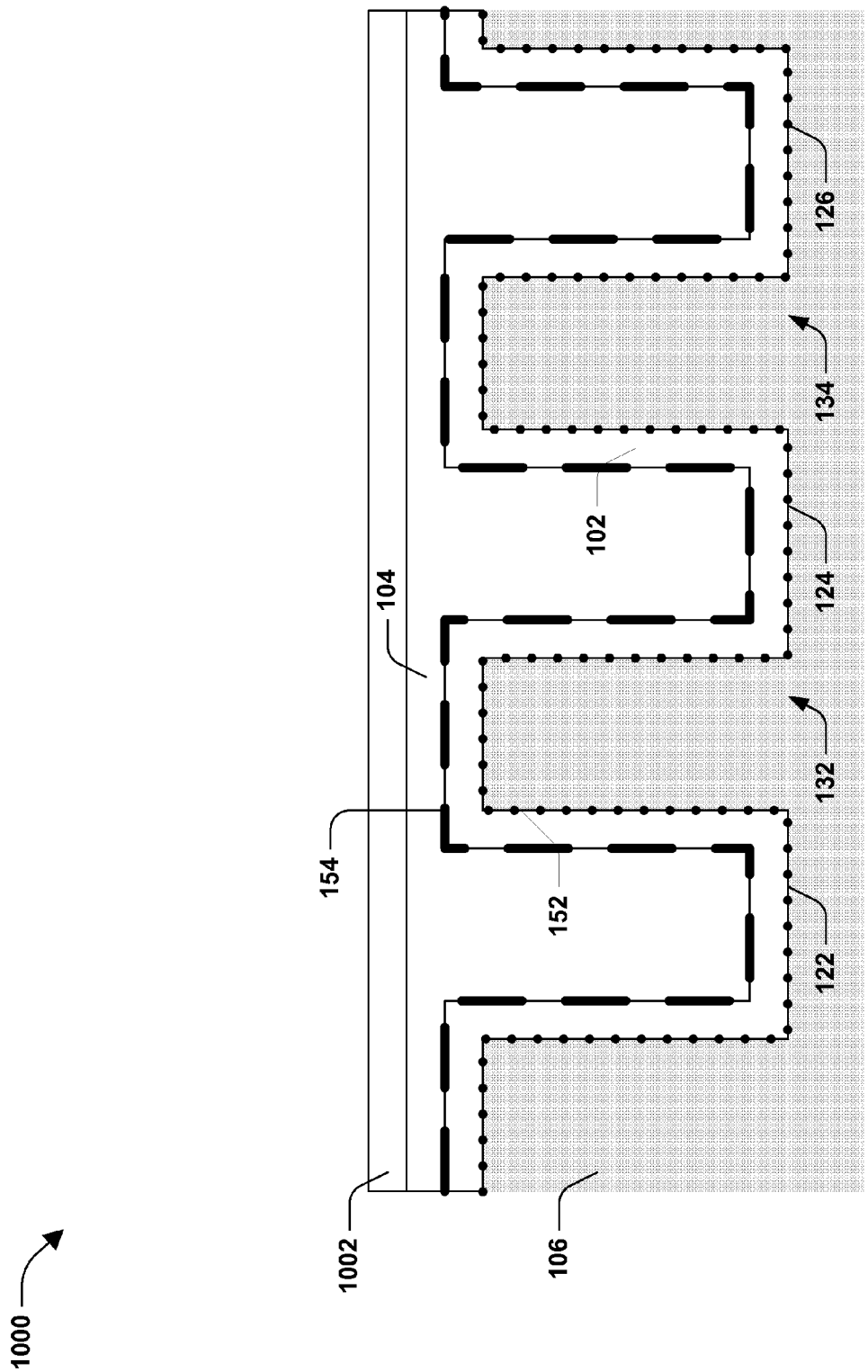
FIG. 10 is a cross-sectional view of an example contact structure for a deep trench capacitor (DTC) during formation, according to some embodiments.

FIG. 10 is a cross-sectional view of an example contact structure 1000 for a deep trench capacitor (DTC) during formation, according to some embodiments. In some embodiments, a third region 1002 is formed above the second region 104. For example, the third region 1002 comprises a nitride, such as silicon nitride. In some embodiments, the third region 1002 comprises any material with a high selectivity to oxide, such as an oxide to silicon nitride (SiN) selectivity greater than twenty, for example.

Figure 11:
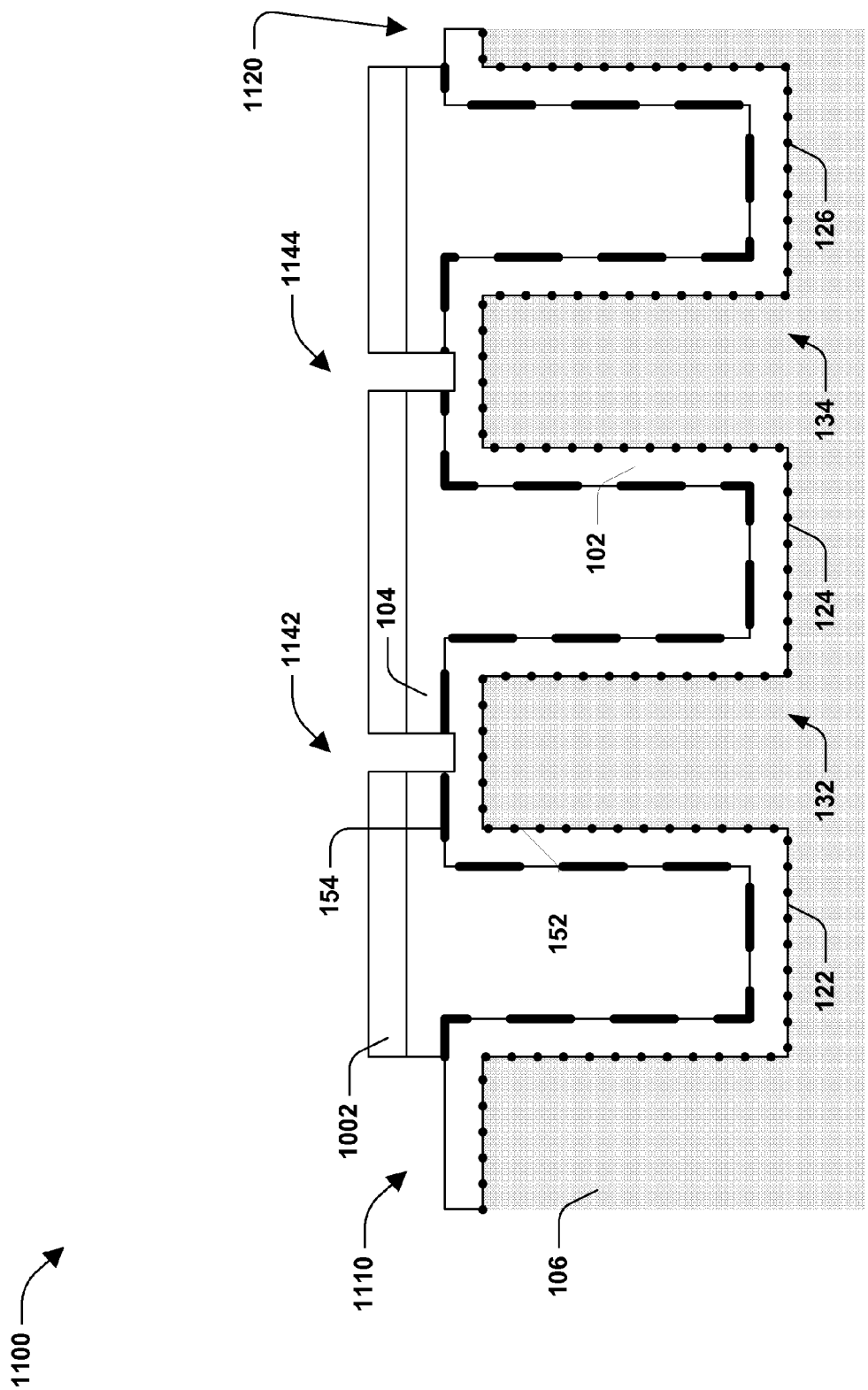
FIG. 11 is a cross-sectional view of an example contact structure for a deep trench capacitor (DTC) during formation, according to some embodiments.

FIG. 11 is a cross-sectional view of an example contact structure 1100 for a deep trench capacitor (DTC) during formation, according to some embodiments. In some embodiments, one or more contact landing spaces are formed in contact structure 1100 based on a first etch or a first mask. For example, a third contact landing space 1142 and a fourth contact landing space 1144 are formed above the first landing region 132 and the second landing region 134, respectively. In some embodiments, the respective contact landing spaces are formed by etching or removing at least some of at least one of the third region 1002, the second region 104, or the second dielectric region 154. Accordingly, a first side 1110 and a second side 1120 of the contact structure 1100 are etched in a similar fashion, according to some embodiments. In this way, a landing area associated with at least one of 1110 or 1120 is mitigated, thus reducing a width of the contact structure 1100. In some embodiments, at least one of 1110 or 1120 is utilized as a landing region, such as a landing region to the first region 102, for example.

Figure 12:
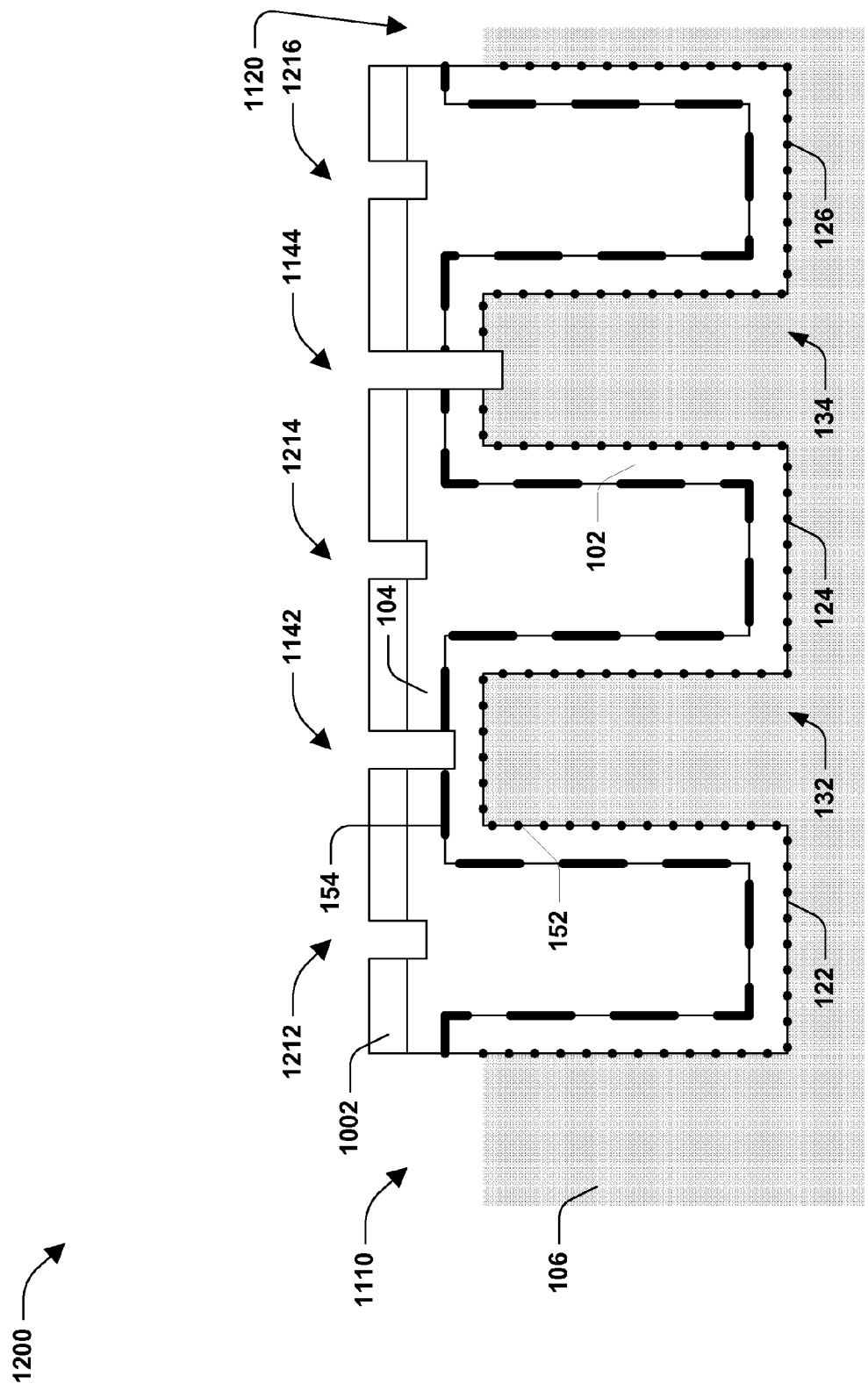
FIG. 12 is a cross-sectional view of an example contact structure for a deep trench capacitor (DTC) during formation, according to some embodiments.

FIG. 12 is a cross-sectional view of an example contact structure 1200 for a deep trench capacitor (DTC) during formation, according to some embodiments. In some embodiments, one or more contact landing spaces are formed in contact structure 1200 based on a second etch or a second mask. For example, the fourth contact landing space 1144 is etched, formed, or modified to reach the substrate region 106. Additionally, at least one of a first contact landing space 1212, a second contact landing space 1214, or a fifth contact landing space 1216 are etched or formed above at least one of the first trench region 122, the second trench region 124, or the third trench region 126, respectively, for example. In some embodiments, the respective contact landing spaces are formed based on at least one of a first etch, a second etch, a first mask, or a second mask. For example, the respective contact landing spaces are formed by etching or removing at least some of at least one of the third region 1002, the second region 104, the second dielectric region 154, the first region 102, the first dielectric region 152, or the substrate region 106. In some embodiments, at least one of 1110 or 1120 is etched to remove at least one of the first region 102 or the first dielectric region 152. In some embodiments, respective areas 1110 or 1120 are utilized as a landing region, such as a landing region to the substrate region 106, for example. In embodiments where 1110 or 1120 are not utilized as a landing region, landing area is mitigated for the contact structure 1200, for example.

Figure 13:
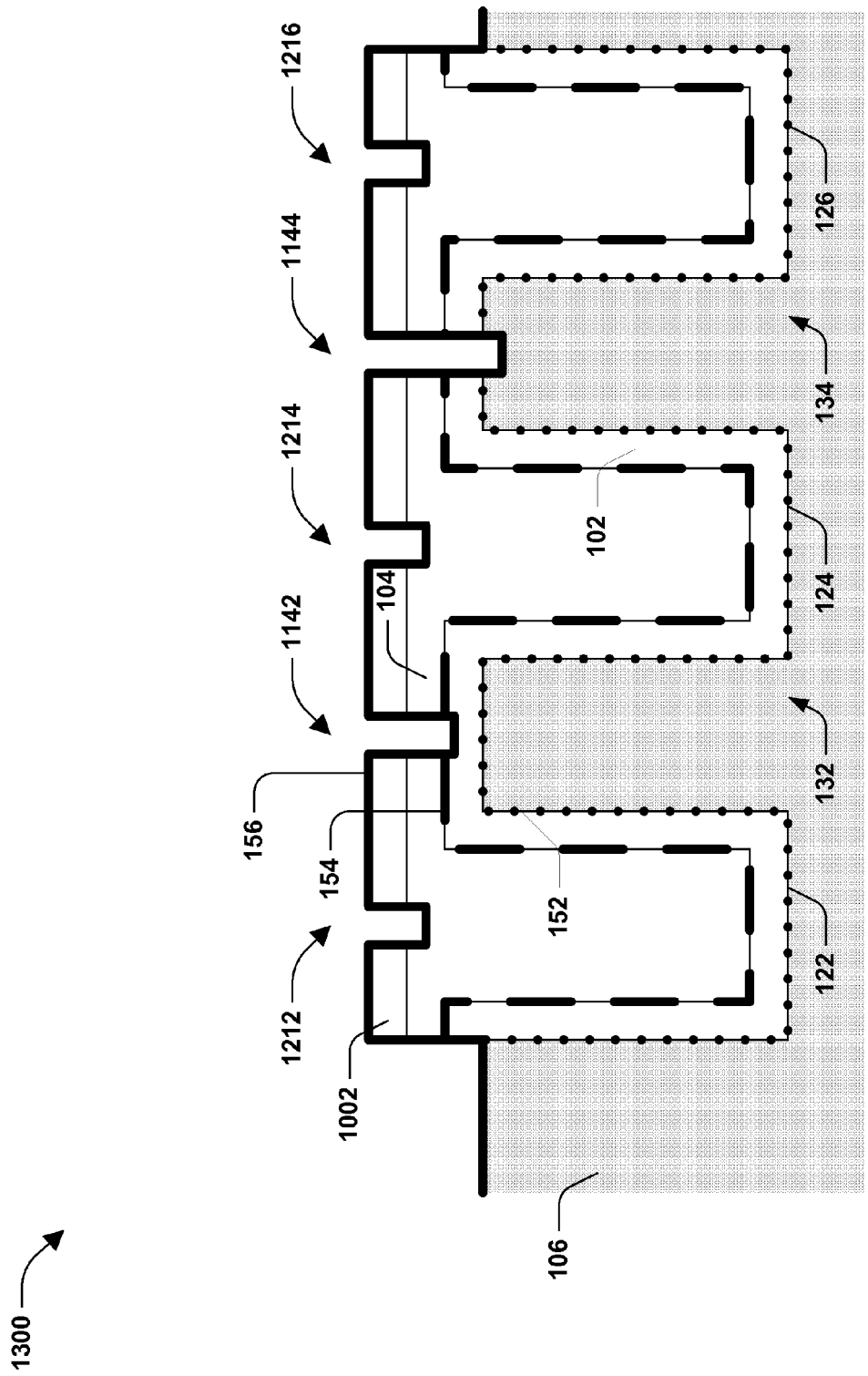
FIG. 13 is a cross-sectional view of an example contact structure for a deep trench capacitor (DTC) during formation, according to some embodiments.

FIG. 13 is a cross-sectional view of an example contact structure 1300 for a deep trench capacitor (DTC) during formation, according to some embodiments. In some embodiments, a fourth region 156 is formed. In some embodiments, the fourth region 156 is formed of a nitride, such as silicon nitride. For example, the fourth region 156 is configured to facilitate alignment of contact landings, at least because the fourth region 156 provides structural support for the contact landings. In some embodiments, the fourth region is formed above at least some of at least one of the third region 1002 or the substrate region 106. Additionally, at least some of the fourth region 156 is formed in at least one of the first contact landing space 1212, the second contact landing space 1214, the third contact landing space 1142, the fourth contact landing space 1144, or the fifth contact landing space 1216. It will be appreciated that in some embodiments, the fourth region 156 is formed as a 'layer' above at least some of at least one of the substrate region 106, the third region 1002, the first region 102, the second region 104, the first dielectric region 152, the second dielectric region 154, etc. Accordingly, at least some of the fourth region 156 is formed along a wall of a contact landing space, such as the wall of the first contact landing space 1212, for example. It will be appreciated that in some embodiments, the third region 1002 and the fourth region 156 comprise a nitride, such as silicon nitride, for example. In such embodiments, the third region 1002 comprises the fourth region 156. Accordingly 'third region' and 'fourth region' are used interchangeably, at least in some of the embodiments described herein.

Figure 14:
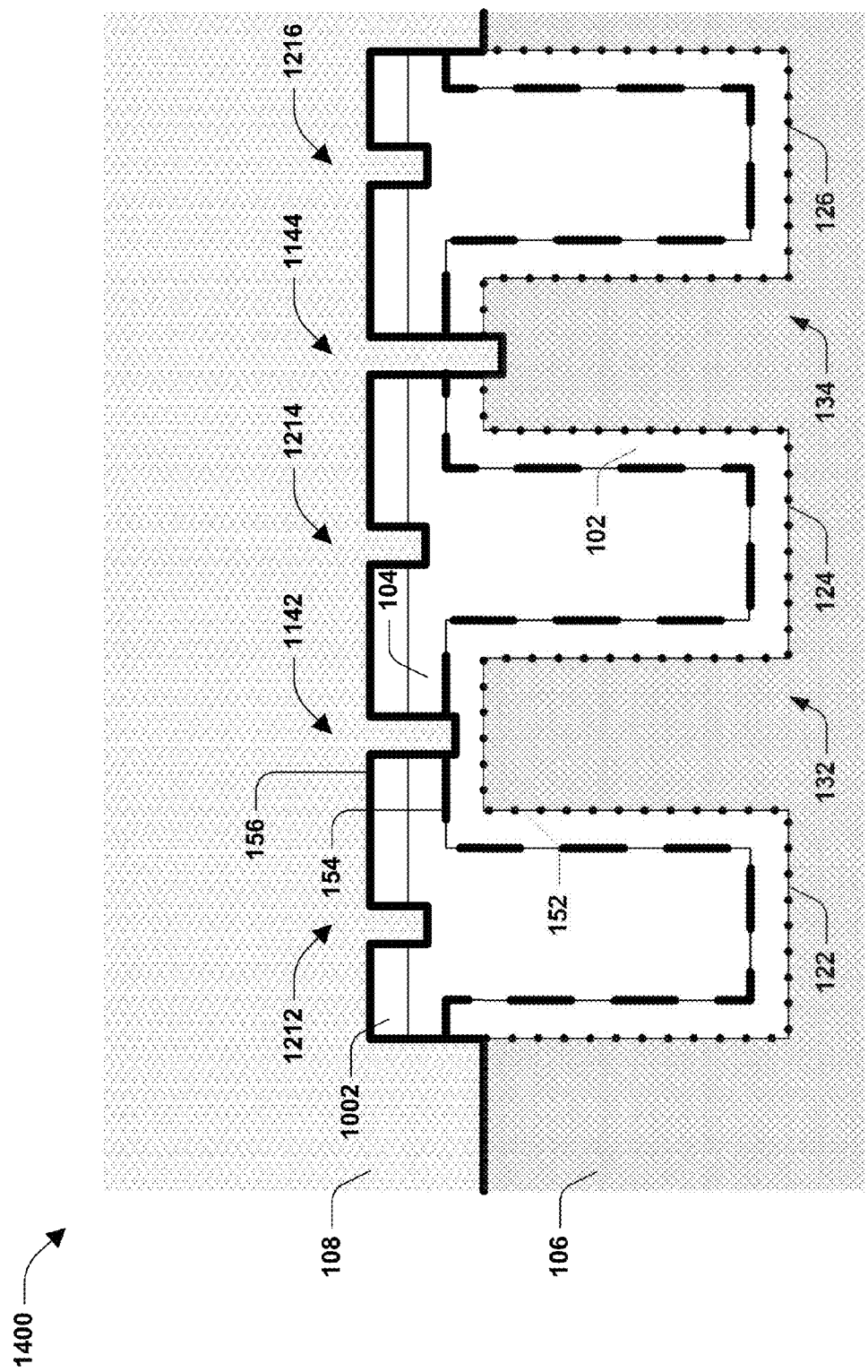
FIG. 14 is a cross-sectional view of an example contact structure for a deep trench capacitor (DTC) during formation, according to some embodiments.

FIG. 14 is a cross-sectional view of an example contact structure 1400 for a deep trench capacitor (DTC) during formation, according to some embodiments. In some embodiments, an oxide region 108 is formed above at least some of at least one of the third region 1002 or fourth region 156. Additionally, at least some of the oxide region 108 is formed in at least one of the first contact landing space 1212, the second contact landing space 1214, the third contact landing space 1142, the fourth contact landing space 1144, or the fifth contact landing space 1216.

Figure 15:
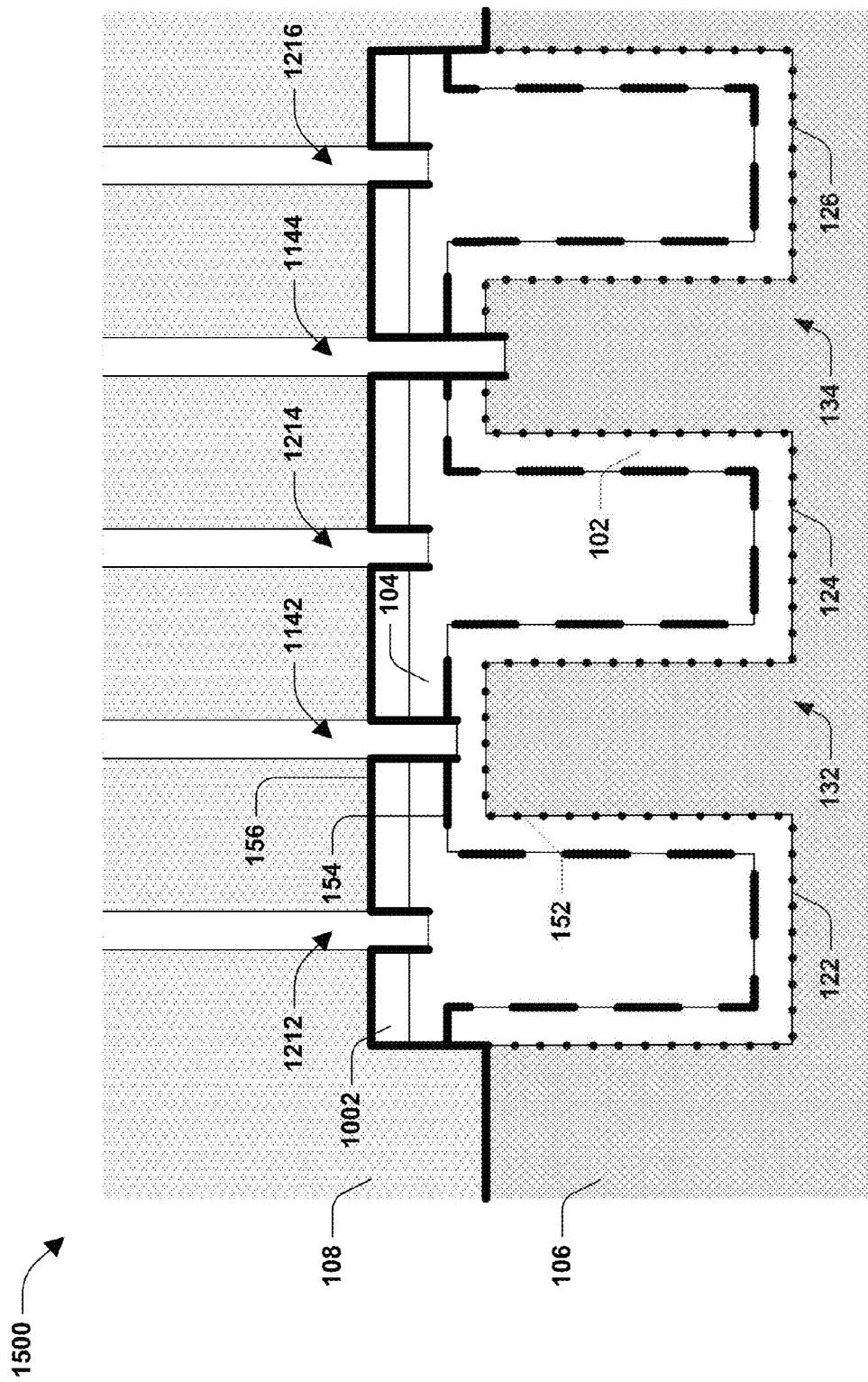
FIG. 15 is a cross-sectional view of an example contact structure for a deep trench capacitor (DTC) during formation, according to some embodiments.

FIG. 15 is a cross-sectional view of an example contact structure 1500 for a deep trench capacitor (DTC) during formation, according to some embodiments. In some embodiments, a contact landing space is etched or removed from the oxide region 108. For example, at least one of the first contact landing space 1212, the second contact landing space 1214, the third contact landing space 1142, the fourth contact landing space 1144, or the fifth contact landing space 1216 is formed in the oxide region 108 based on an etch or a mask.

Figure 16:
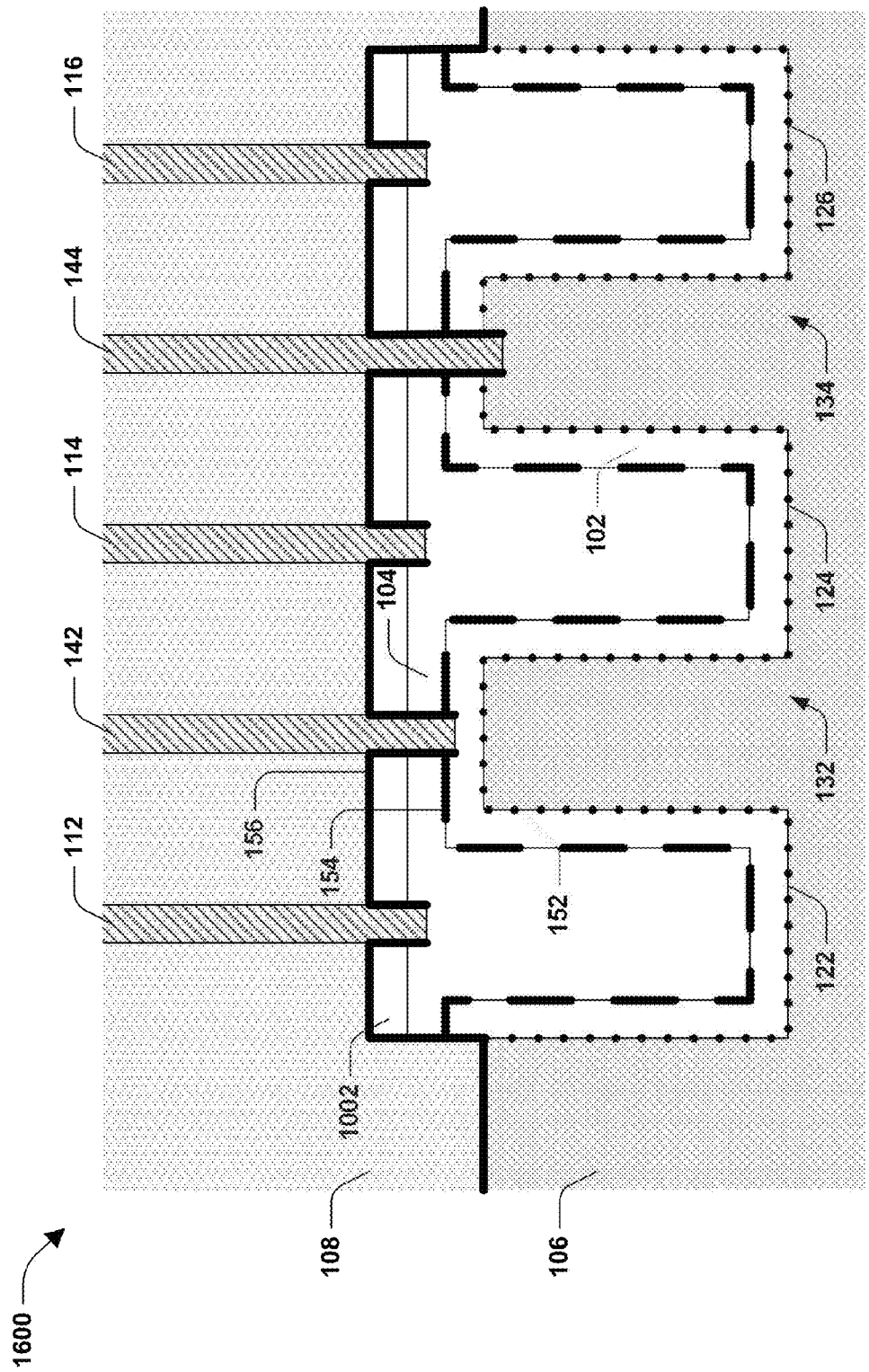
FIG. 16 is a cross-sectional view of an example contact structure for a deep trench capacitor (DTC), according to some embodiments.

FIG. 16 is a cross-sectional view of an example contact structure 1600 for a deep trench capacitor (DTC) during formation, according to some embodiments. In some embodiments, a first contact landing 112 is formed in the first contact landing space 1212 of FIG. 15 such that the first contact landing 112 is in contact with the second region 104. Additionally, the first contact landing 112 is formed through the oxide region 108, the fourth region 156, the third region 1002, and the second region 104, for example. Similarly, a second contact landing 114 is formed in the second contact landing space 1214 of FIG. 15 such that the second contact landing 114 is in contact with the second region 104. Additionally, the second contact landing 114 is formed through the oxide region 108, the fourth region 156, the third region 1002, and the second region 104, for example. Additionally, a third contact landing 142 is formed in the third contact landing space 1242 of FIG. 15 such that the third contact landing 142 is in contact with the first region 102. Additionally, the third contact landing 142 is formed through the oxide region 108, the fourth region 156, the third region 1002, the second region 104, the second dielectric region 154, and the first region 102, for example. A fourth contact landing 144 is formed in the fourth contact landing space 1244 of FIG. 15 such that the fourth contact landing 144 is in contact with the substrate region 106. Additionally, the fourth contact landing 144 is formed through the oxide region 108, the fourth region 156, the third region 1002, the second region 104, the second dielectric region 154, the first region 102, the first dielectric region 152, and the substrate region 106, for example. In some embodiments, a fifth contact landing 116 is formed in the fifth contact landing space 1216 of FIG. 15 such that the fifth contact landing 116 is in contact with the second region 104. Additionally, the fifth contact landing 116 is formed through the oxide region 108, the fourth region 156, the third region 1002, and the second region 104, for example. In this way, additional contact landings, such as the third contact landing 142 and the fourth contact landing 144 are provided. It will be appreciated that no additional lithography masks are required for the contact structure 1600 of FIG. 16. In some embodiments, the additional contact landings are associated with an increased number of contact landings, a decreased resistance for the contact structure 1600, or an increased capacitance for the contact structure 1600.

Figure 17:
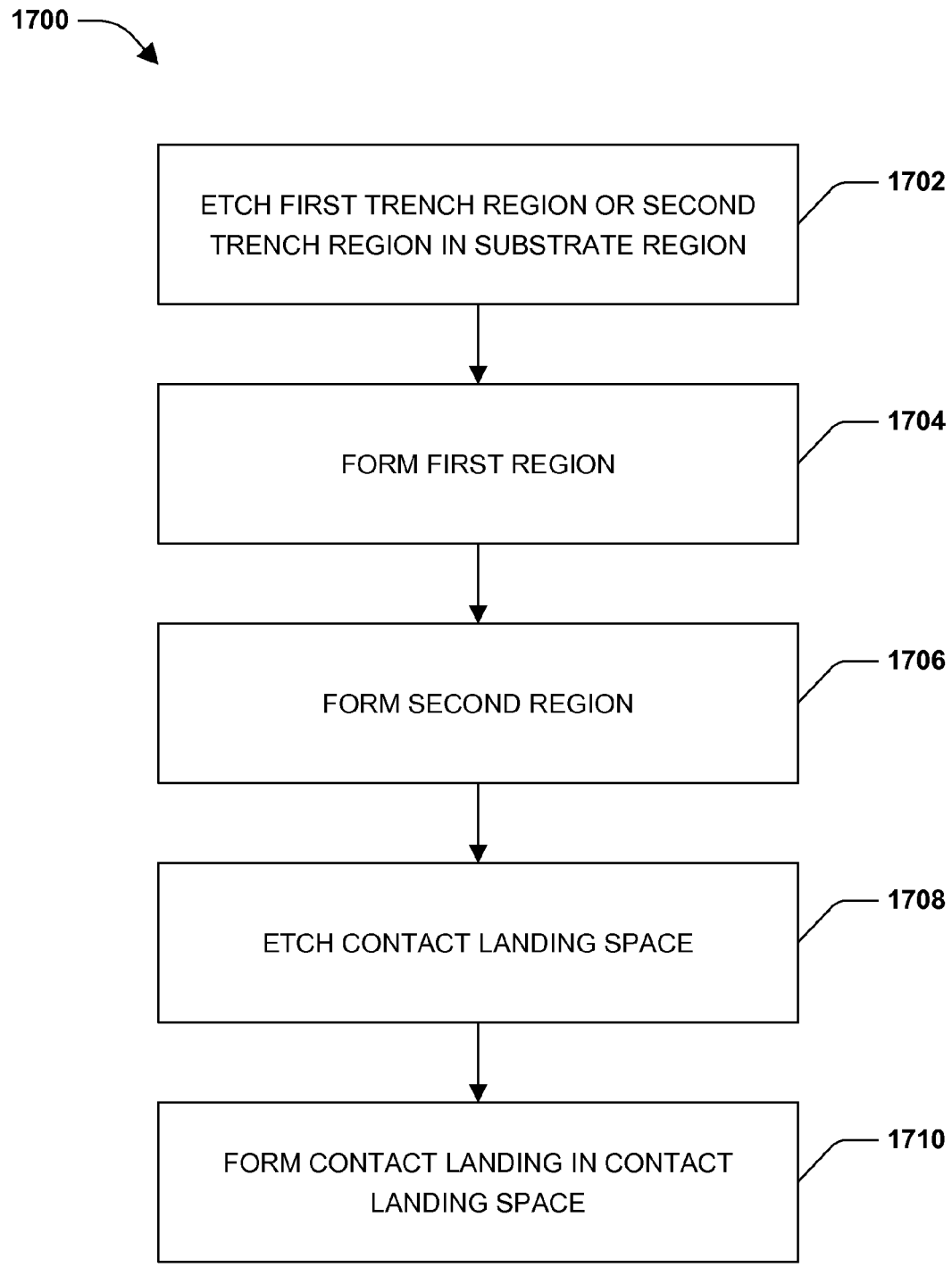
FIG. 17 is a flow diagram of an example method for forming a contact structure for a deep trench capacitor (DTC), according to some embodiments.

FIG. 17 is a flow diagram of an example method 1700 for forming a contact structure for a deep trench capacitor (DTC), according to some embodiments. In some embodiments, the method 1700 comprises etching at least one of a first trench region or a second trench region in a substrate region at 1702. For example, at least one of the first trench region or the second trench region is etched adjacent to a first landing region. In some embodiments, a first region is formed at 1704. In some embodiments, the first region is formed at least one of above at least some of the substrate region or in at least one of the first trench region or the second trench region. In some embodiments, the method 1700 comprises forming a first dielectric region between the substrate region and the first region. Additionally, a second region is formed at 1706. In some embodiments, the second region is formed at least one of above at least some of the first region or in at least one of the first trench region or the second trench region. In some embodiments, at least one of the first region or the second region is formed of polysilicon. In some embodiments, the method 1700 comprises forming a second dielectric region between the first region and the second region. In some embodiments, a third region is formed. For example, the third region comprises silicon nitride. In some embodiments, the third region is formed along a wall of the contact landing space. In some embodiments, the third region is formed above at least some of the second region. At 1708, a contact landing space is etched. For example, the contact landing space is etched above at least one of the first trench region, the second trench region, or the first landing region. In some embodiments, the contact landing space is etched through at least one of at least some of the first region, at least some of the second region, or at least some of the substrate region. According to some aspects, etching the contact landing space comprises a first etch through at least some of the second region or a second etch through at least some of the first region. At 1710, a contact landing is formed in the contact landing space. For example, the contact landing is formed in the contact landing space to be in contact with at least one of the first region, the second region, or the substrate region. In some embodiments, an oxide region is formed above at least some of the second region.

According to some aspects, contact structure for a deep trench capacitor (DTC) is provided, comprising a substrate region. For example, the substrate region comprises a first trench region, a first landing region, and a second trench region. In some embodiments, the first landing region is between the first trench region and the second trench region. Additionally, the contact structure for the DTC comprises a first region above at least some of the substrate region. In some embodiments, at least some of the first region is in at least one of the first trench region or the second trench region. Additionally, the contact structure for the DTC comprises a second region above at least some of the first region. In some embodiments, at least some of the second region is in at least one of the first trench region or the second trench region. The contact structure comprises a first contact landing, a second contact landing, and a third contact landing. For example, the first contact landing is above the first trench region and in contact with the second region. For another example, the second contact landing is above the second trench region and in contact with the second region. Additionally, the third contact landing is above the first landing region and in contact with at least one of the substrate region or the first region.

According to some aspects, a method for forming a contact structure for a deep trench capacitor (DTC) is provided, comprising etching at least one of a first trench region or a second trench region in a substrate region. In some embodiments, at least one of the first trench region or the second trench region is etched adjacent to a first landing region. In some embodiments, the method comprises forming a first region and forming a second region. For example, the first region is formed at least one of above at least some of the substrate region or in at least one of the first trench region or the second trench region. For example, the second region is formed at least one of above at least some of the first region or in at least one of the first trench region or the second trench region. In some embodiments, the method comprises etching a contact landing space above at least one of the first trench region, the second trench region, or the first landing region. For example, the contact landing space is etched through at least one of at least some of the first region, at least some of the second region, or at least some of the substrate region. In some embodiments, the method comprises forming a contact landing in the contact landing space to be in contact with at least one of the first region, the second region, or the substrate region.

According to some aspects, a contact structure for a deep trench capacitor (DTC) is provided, comprising a substrate region. For example, the substrate region comprises a first trench region, a first landing region, and a second trench region. In some embodiments, the first landing region is between the first trench region and the second trench region. In some embodiments, the contact structure comprises a first region above at least some of the substrate region. Additionally, at least some of the first region is in at least one of the first trench region or the second trench region. In some embodiments, a second region is above at least some of the first region. Additionally, at least some of the second region is in at least one of the first trench region or the second trench region. In some embodiments, the contact structure comprises a first dielectric region between the substrate region and the first region and a second dielectric region between the first region and the second region. Additionally, the contact structure comprises a first contact landing, a second contact landing, and a third contact landing. For example, the first contact landing is in a first contact landing space above the first trench region and in contact with the second region. For example, the second contact landing is in a second contact landing space above the second trench region and in contact with the second region. For example, the third contact landing is in a third contact landing space above the first landing region and in contact with at least one of the substrate region or the first region. In some embodiments, the contact structure comprises a third region above at least some of the second region. In some embodiments, at least some of the third region is in at least one of the first contact landing space, the second contact landing space, or the third contact landing space. In some embodiments, the contact structure comprises an oxide region above at least some of the third region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first region, second region, third region, substrate region, first landing region, first trench region, second trench region, first contact landing, second contact landing, third contact landing, first dielectric region, second dielectric region, oxide region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A contact structure for a deep trench capacitor (DTC), comprising:
   a substrate region comprising a first trench region, a first landing region, and a second trench region, the first landing region between the first trench region and the second trench region;
   a first dielectric region above and in contact with at least some of the substrate region, at least some of the first dielectric region in at least one of the first trench region or the second trench region;

a first region above and in contact with at least some of the first dielectric region, at least some of the first region in at least one of the first trench region or the second trench region;

a second region above at least some of the first region, at least some of the second region in at least one of the first trench region or the second trench region;

a first contact landing vertically coincident with the first trench region and in contact with the second region to form a first electrical interconnect with the second region, the first contact landing electrically isolated from the substrate region;

a second contact landing vertically coincident with the second trench region and in contact with the second region to form a second electrical interconnect with the second region, the second contact landing electrically isolated from the substrate region;

a third contact landing vertically coincident with the first landing region and in contact with at least one of the substrate region to form a third electrical interconnect with the substrate region or the first region to form a fourth electrical interconnect with the first region; and a silicon nitride region in contact with a top surface of the second region and in contact with a sidewall of the second region.

2. The contact structure for the deep trench capacitor (DTC) of claim 1, at least one of the first region or the second region comprising polysilicon.

3. The contact structure for the deep trench capacitor (DTC) of claim 1, the silicon nitride region in contact with a sidewall of the first region.

4. The contact structure for the deep trench capacitor (DTC) of claim 1, comprising a second dielectric region above and in contact with at least some of the first region, wherein the second region is above and in contact with at least some of the second dielectric region.

5. The contact structure for the deep trench capacitor (DTC) of claim 1, comprising an oxide region above and in contact with the silicon nitride region.

6. The contact structure for the deep trench capacitor (DTC) of claim 1, the substrate region comprising a p-type substrate.

7. The contact structure for the deep trench capacitor (DTC) of claim 1, the third contact landing extending through the second region.

8. The contact structure for the deep trench capacitor (DTC) of claim 1, comprising an oxide region above at least some of the second region and the silicon nitride region.

9. The contact structure for the deep trench capacitor (DTC) of claim 1, comprising a second landing region adjacent to the second trench region.

10. The contact structure for the deep trench capacitor (DTC) of claim 9, comprising a third trench region adjacent to the second landing region.

11. A contact structure for a deep trench capacitor (DTC), comprising:

a substrate region comprising a first trench region, a first landing region, and a second trench region, the first landing region between the first trench region and the second trench region;

a first dielectric region above and in contact with at least some of the substrate region, at least some of the first dielectric region in at least one of the first trench region or the second trench region;

an electrically conductive first region above and in contact with at least some of the first dielectric region, at least some of the electrically conductive first region in at least one of the first trench region or the second trench region;

a second region above at least some of the electrically conductive first region, at least some of the second region in at least one of the first trench region or the second trench region;

a first contact landing vertically coincident with the first trench region and in contact with the second region;

a second contact landing vertically coincident with the second trench region and in contact with the second region;

a third contact landing vertically coincident with the first landing region and in contact with the electrically conductive first region;

a second dielectric region in contact with a top surface of the second region and in contact with a sidewall of the second region; and a third dielectric region in contact with a top surface of the second dielectric region.

12. A contact structure for a deep trench capacitor (DTC), comprising:

a substrate region comprising:

a landing region between a first trench region and a second trench region of a substrate;

a second landing region between the second trench region and a third trench region of the substrate;

a first dielectric region above and in contact with at least some of the substrate region;

a first contact landing vertically coincident with the landing region and in contact with a first region above and in contact with at least some of the first dielectric region to form a first electrical interconnect with the first region;

a second dielectric region above and in contact with at least some of the first region;

a second contact landing vertically coincident with the first trench region and in contact with a second region above the first region to form a second electrical interconnect with the second region;

a third contact landing vertically coincident with the second landing region and in contact with the substrate to form a third electrical interconnect with the substrate;

a first silicon nitride layer in contact with a top surface of the second region; and a second silicon nitride layer in contact with a sidewall of the first silicon nitride layer and a sidewall of the second region.

13. The contact structure for a deep trench capacitor (DTC) of claim 12, comprising:

a fourth contact landing vertically coincident with the second trench region and in contact with the second region to form a fourth electrical interconnect with the second region.

14. The contact structure for a deep trench capacitor (DTC) of claim 12, the second silicon nitride layer in contact with a sidewall of the first region.

15. The contact structure for a deep trench capacitor (DTC) of claim 12, the first region above the landing region, in the first trench region, and in the second trench region.

16. The contact structure for a deep trench capacitor (DTC) of claim 12, comprising an oxide region above the second silicon nitride layer, the first contact landing and the second contact landing extending through the oxide region.

17. The contact structure for a deep trench capacitor (DTC) of claim 12, the second silicon nitride layer in contact with a top surface of the first silicon nitride layer.

18. The contact structure for a deep trench capacitor (DTC) of claim 12, the second region above and in contact with at least some of the second dielectric region.

19. The contact structure for a deep trench capacitor (DTC) of claim 12, the first contact landing comprising a metal.

20. The contact structure for a deep trench capacitor (DTC) of claim 12, the second contact landing not in contact with the substrate.

\* \* \* \* \*